(12) United States Patent
Worley et al.

(10) Patent No.: US 6,518,604 B1
(45) Date of Patent: Feb. 11, 2003

(54) DIODE WITH VARIABLE WIDTH METAL STRIPES FOR IMPROVED PROTECTION AGAINST ELECTROSTATIC DISCHARGE (ESD) CURRENT FAILURE

(75) Inventors: Eugene R. Worley, Irvine, CA (US); Mishel Matloubian, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/667,364

(22) Filed: Sep. 21, 2000

(51) Int. Cl.⁷ .................. H01L 29/74; H01L 31/0352
(52) U.S. Cl. ................. 257/173; 257/653; 257/654
(58) Field of Search ............... 257/46, 355, 481, 257/601, 653, 654, 173–4, 362, 367, 361, 653.4

(56) References Cited

U.S. PATENT DOCUMENTS

| | | | |
|---|---|---|---|
| 3,396,317 A | * | 8/1968 | Vendelin |
| 4,561,008 A | | 12/1985 | Becke |
| 4,607,273 A | | 8/1986 | Sakurade et al. |
| 5,250,820 A | | 10/1993 | Sawase et al. |

FOREIGN PATENT DOCUMENTS

GB  2 133 641  7/1984

OTHER PUBLICATIONS

Verlinden, P., et al., "High Effciency Large Area Black Contact Concentrator Solar Cells with a Multilevel Interconnection," *International Journal of Solar Enery.* 6: 347–366 (1988).

* cited by examiner

*Primary Examiner*—Nathan J. Flynn
*Assistant Examiner*—Johannes P. Mondt
(74) *Attorney, Agent, or Firm*—Brobeck, Phleger & Harrison, LLP

(57) ABSTRACT

A diode for improved electrostatic discharge (ESD) protection against current failure includes a plurality of elongate anode and cathode conductor stripes each having first and second end portions of different widths to reduce current densities at feeder bus tie points, thereby reducing the possibility of current failure.

20 Claims, 2 Drawing Sheets

DIODE WITH VARIABLE WIDTH METAL STRIPES FOR IMPROVED PROTECTION AGAINST ELECTROSTATIC DISCHARGE (ESD) CURRENT FAILURE

BACKGROUND OF THE INVENTION

1. Field of the Invention

The present invention relates to semiconductors and semiconductor fabrication, and more particularly, to the fabrication of diodes.

2. Background

The downscaling of semiconductor processes to deep submicron dimensions has permitted the layout of very dense ESD protection diodes which are required to support high current densities under an ESD discharge. Thus, a conventional diode for ESD protection is capable of providing a very high conductivity per unit area. However, the current failure point, which defines the limitation on the maximum current through a diode is typically very low for a conventional diode fabricated with deep submicron technology. In typical instances, the current failure point of a conventional diode for ESD protection is determined by metal temperature effects to a greater extent than diode contact effects and silicon temperature effects.

In a conventional diode for ESD protection, a plurality of elongate cathode metal stripes and a plurality of elongate anode metal stripes each having a predetermined constant width are implemented on a semiconductor substrate. The cathode metal stripes are connected to a cathode feeder bus while the anode metal stripes are connected to an anode feeder bus. The cathode and anode metal stripes are alternately spaced from each other on the semiconductor substrate, which typically comprises silicon. A plurality of diffusion windows are provided along each of the anode and cathode metal stripes to serve as contacts for P and N junctions, respectively.

During the fabrication of a conventional diode for ESD protection, a P+ dopant is implanted through field oxide windows along the anode metal stripes into regions of the semiconductor substrate underneath the anode metal stripes to form respective P+ regions. In a similar manner, an N+ dopant is implanted through field oxide windows along the cathode metal stripes into regions of the semiconductor substrate underneath the cathode metal stripes to form respective N+ regions. In a typical fabrication process, anode and cathode metal stripes of a constant width are implemented in a conventional diode for ESD protection with a relatively simple layout geometry while providing a relatively high conductivity per unit area along the cathode and anode metal stripes.

The current failure point of a conventional diode for ESD protection is primarily determined by the current per unit of metal width of each of the anode and cathode metal stripes because the heating of the metal stripes is essentially adiabatic. In a conventional diode for ESD protection which includes anode metal stripes of a constant width, the current flow starts at zero at the end of each of the anode metal stripes and ramps up in an essentially linear manner until a peak current is reached at the feeder bus tie point, which is the location at which the anode metal stripe is connected to the anode metal feeder bus. A current failure typically occurs at one or more locations at which the metal stripes are connected to the respective anode and cathode metal feeder busses, because current densities at these locations are at a maximum in a conventional diode for ESD protection.

SUMMARY OF THE INVENTION

The present invention provides a diode for ESD protection, roughly comprising:

a cathode feed bus;

an anode feeder bus positioned opposite the cathode feeder bus;

a plurality of elongate cathode conductor stripes each having first and second end portions of different widths, the first end portion connected to the cathode feeder bus, the width of the second end portion narrower than that of the first end portion; and a plurality of elongate anode conductor stripes each having first and second end portions of different widths, the first end portion connected to the anode feeder bus, the width of the second end portion narrower than that of the first end portion, the cathode conductor stripes and the anode conductor stripes alternately spaced from each other.

Advantageously, the diode in an embodiment according to the present invention is capable of providing improved electrostatic discharge (ESD) protection against current failure by reducing current densities along the anode and cathode conductor stripes, especially at or near the locations at which the anode and cathode conductor stripes are connected to the anode and cathode feeder busses, respectively. Furthermore, improved protection against current failure can be achieved by the diode in an embodiment according to the present invention using existing deep submicron fabrication technology without the need for more complicated fabrication processes.

BRIEF DESCRIPTION OF THE DRAWINGS

The present invention will be described with particular embodiments thereof, and references will be made to the drawings in which.

DETAILED DESCRIPTION

Figure 1:
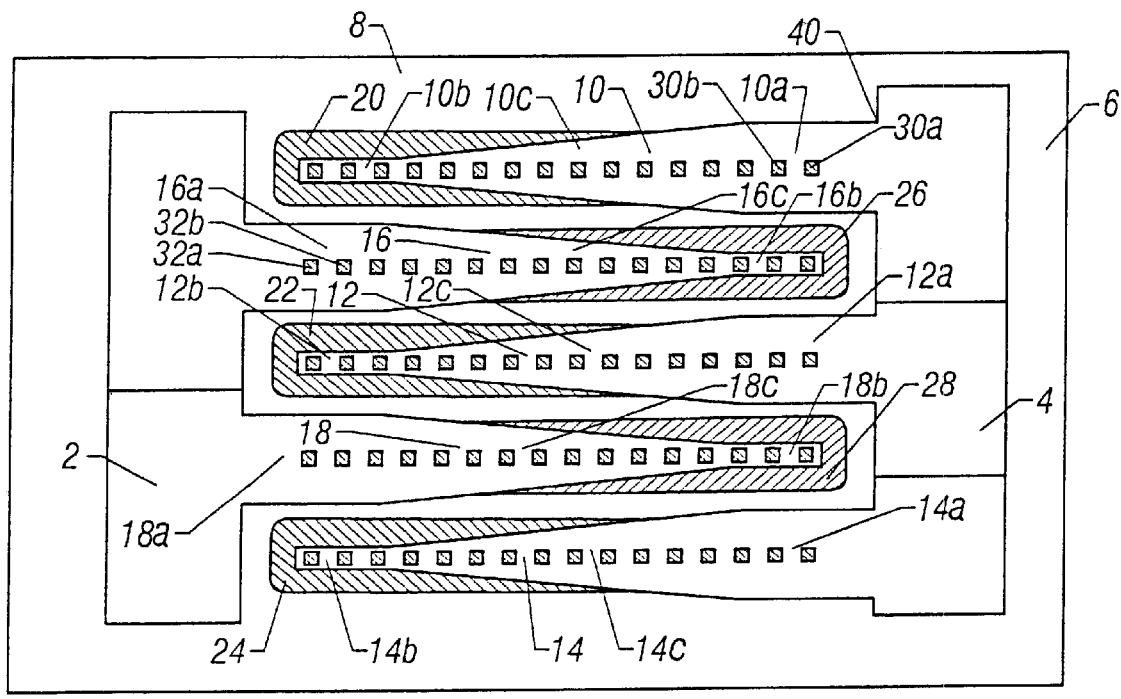
FIG. 1 shows a plan view of a diode for electrostatic discharge (ESD) protection in an embodiment according to the present invention, in which a continuously tapered intermediate portion is provided between the end portions of each of the cathode and anode conductor stripes.

FIG. 1 shows a plan view of an embodiment of a diode for improved electrostatic discharge (ESD) protection in accordance with the present invention. In FIG. 1, a cathode feeder bus (2) and an anode feeder bus (4) are disposed opposite each other on substantially the same surface (8) of a semiconductor substrate (6), for example, a silicon substrate. A plurality of elongate anode conductor stripes (10), (12) and (14) and a plurality of elongate cathode conductor stripes (16) and (18) are provided on the surface (8) of the semiconductor substrate (6). The cathode conductor stripes (16)

and (18) and the anode conductor stripes (10), (12) and (14) are alternately spaced from each other in parallel in the embodiment shown in FIG. 1.

The anode conductor stripes (10), (12) and (14) have first portions (10a), (12a) and (14a) connected to the anode feeder bus (4), second end portions (10b), (12b) and (14b) opposite the first end portions, (10a), (12a) and (14a), and intermediate portions (10c), (12c) and (14c) between the first and second end portions, respectively. The second end portion of each of the anode conductor stripes (10), (12) and (14) has a width narrower than that of the first end portion, and the width of the intermediate portion is continuously tapered from the first end portion to the second end portion.

In a similar manner, the elongate cathode conductor stripes (16) and (18) have first portions (16a) and (18a) connected to the cathode feeder bus (2), second end portions (16b) and (18b) opposite the first end portions (16a) and (18a), and intermediate portions (16c) and (18c) between the first and second end portions, respectively. The second end portion of each of the cathode conductor stripes (16) and (18) has a width narrower than that of the first end portion, and the width of the intermediate portion is continuously tapered from the first end portion to the second end portion.

In the semiconductor substrate (6), a plurality of P+ doped regions (20), (22) and (24) are formed in the semiconductor substrate (6) underneath the elongate anode conductor stripes (10), (12) and (14), respectively. Furthermore, a plurality of elongate N+ doped regions (26) and (28) are also formed in the semiconductor substrate (6) underneath the elongate cathode conductor stripes (16) and (18), respectively. As shown in FIG. 1, the P+ doped regions (20), (22) and (24) and the N+ doped regions (26) and (28) are alternately spaced from each other in the semiconductor substrate (6).

The anode and cathode conductor stripes, which are positioned directly on top of the P+ and N+ doped regions, respectively, each have a plurality of contact windows (30a), (30b), . . . serving as junction contacts in an embodiment. The formation of N+ and P+ doped regions in a semiconductor substrate can be performed in a conventional manner apparent to a person skilled in the art. Furthermore, the cathode feeder bus (2), the anode feeder bus (4), the cathode conductor stripes (16) and (18), and the anode conductor stripes (10) (12) and (14) can be fabricated by depositing a metallic layer on the surface (8) of the semiconductor substrate (6) and patterning and etching the metallic layer in a conventional manner apparent to a person skilled in the art.

Figure 2:
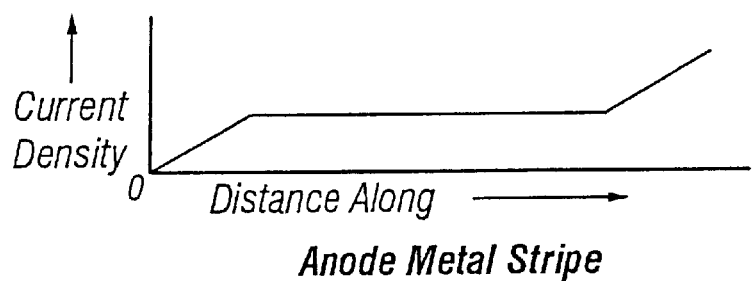
FIG. 2 shows a plot of current density vs. distance along one of the anode conductor stripes in the embodiment shown in FIG. 1.

FIG. 2 shows a plot of the cross section current density along the elongate anode conductor stripe (10) from the second end portion (10b) to the first end portion (10a) in FIG. 1. In the embodiment shown in FIG. 1, the second end portion (10b) of the anode conductor stripe (10) has a constant width which is narrower than that of the first end portion (10a) connected to the anode feeder bus (4). The intermediate portion (10c) is a continuously tapered portion with linearly increasing widths from the second end portion (10b) to the first end portion (10a). As shown in FIG. 2, the current density increases from the end of the anode conductor stripe (10) in the second end portion (10b), and remains substantially constant along the continuously tapered intermediate portion (10c). In the first end portion (10a), which has a constant width in the embodiment shown in FIG. 1, the current density increases further as it approaches the anode feeder bus (4).

If the continuously tapered intermediate portion (10c) is much longer than the lengths of the first and second portions (10a) and (10b), the current density remains substantially constant along a substantial portion of the anode conductor stripe (10). The current density at the feeder bus tie point (40), which is the location at which the anode conductor stripe (10) is connected to the anode feeder bus (4), is substantially reduced compared to the current densities at feeder bus tie points of conventional diodes with anode conductor stripes of constant widths. The reason for setting the minimum width in many practical applications is the process rule requirement concerning metal coverage of the contact. Ideally, the metal width would go to zero at the ends if it were not for this contact rule requirement. More than one tapered metal layer mirroring the first metal layer can be applied using vias to connect one level of metal with another.

Figure 3:
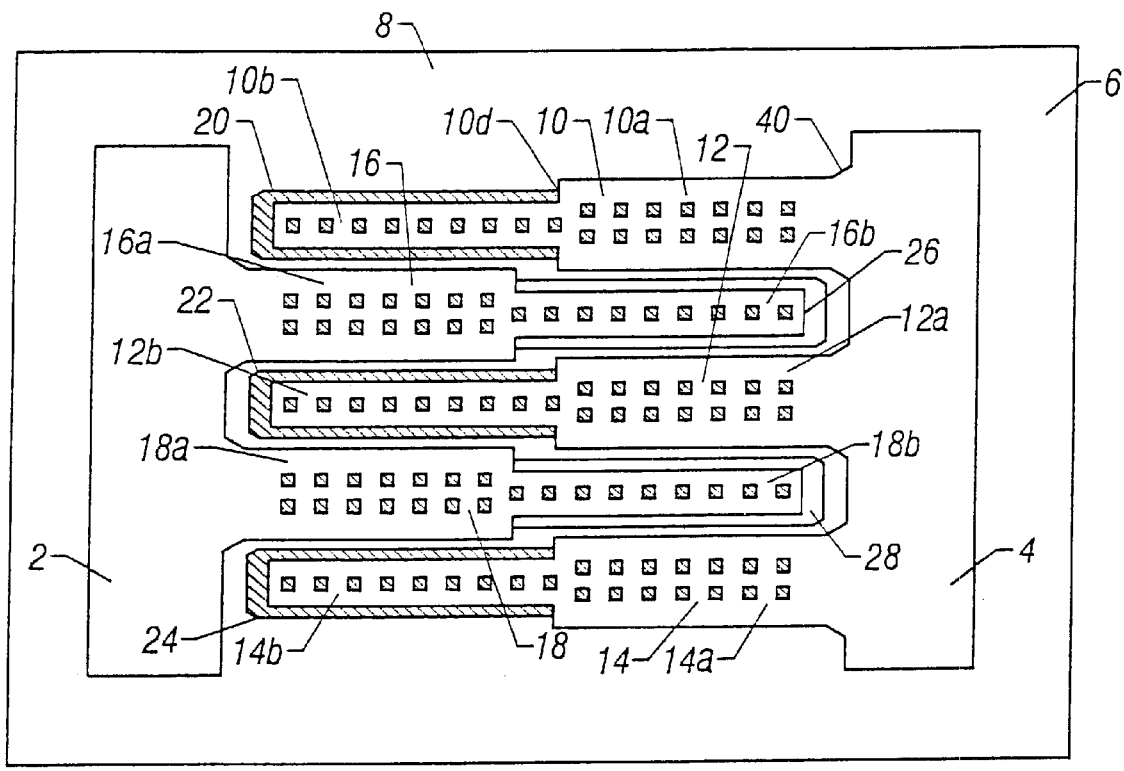
FIG. 3 shows a plan view of another embodiment of the diode for ESD protection according to the present invention, in which the width of each of the cathode and anode conductor stripes is abruptly changed in an intermediate portion between the end portions of the conductor stripes.

FIG. 3 shows a plan view of another embodiment of the diode for ESD protection according to the present invention, in which the intermediate portion of each of the anode conductor stripes (10), (12) and (14) and cathode conductor stripes (16) and (18) has an abrupt change in width to reduce the current density along each of the anode and cathode conductor stripes. In this embodiment, an abrupt change of width at a midpoint between the first and, second end portions of each of the anode and cathode conductor stripes causes a reduction of cross section current density along each conductor stripe. In an embodiment, the width of the first end portions (10a), (12a) and (14a) of the anode conductor stripes (10), (12) and (14) and the first end portions (16a) and (18a) of the cathode conductor stripes (16) and (18) is about twice as wide as that of the second end portions (10b), (12b) and (14b) of the anode conductor stripes and the second end portions (16b) and (18b) of the cathode conductor stripes, respectively.

Figure 4:
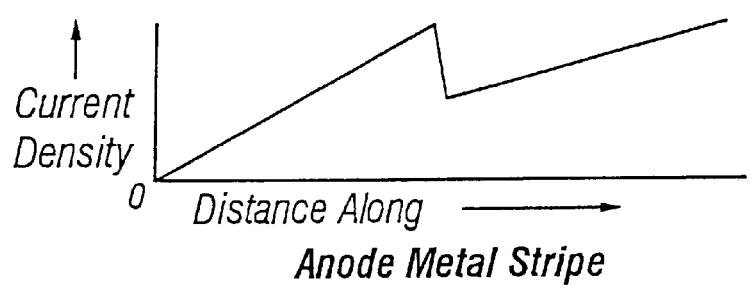
FIG. 4 shows a plot of current density vs. distance along one of the anode conductor stripes in the embodiment shown in FIG. 3.

FIG. 4 shows a plot of cross section current density along the anode conductor stripe (10) for the embodiment of the diode shown in FIG. 3. Because the width of the anode conductor stripe (10) is constant in the second end portion (10b), the current density increases linearly in the second portion. At the midpoint (10d) of the anode conductor stripe (10), an abrupt change in the width of the anode conductor stripe causes a sudden drop in current density at this point. In the first end portion (10a) of the anode conductor stripe (10), the width of the anode conductor stripe remains constant, and the current density in this portion increases linearly from the midpoint (10d) to the feeder bus tie point (40), which is the location at which the second end portion (10a) of the anode conductor stripe (10) is connected to the anode feeder bus (4). In an embodiment in which the width of the first end portion (10a) of the anode conductor stripe (10) is about twice that of the second end portion (10b), the current density at the midpoint (10d) of the anode conductor stripe (10) is decreased by about 50%. The current density at the feeder bus tie point (40) is thus approximately equal to the current density at the midpoint (10d) before the sudden drop in current density.

Although FIG. 3 shows one stepwise change in the width of the anode and cathode conductor stripes, multiple stepwise changes in the widths of the anode and the cathode conductor stripes may be provided in the layout of a diode in a different embodiment within the scope of the present invention. Furthermore, the intermediate portion of the anode and cathode conductor stripes in FIG. 1 need not be a linear taper in a different embodiment. For example, tapered intermediate portions with curvatures may be designed in the layout for the anode and cathode conductor stripes in different embodiments. Furthermore, a combination of tapers and stepwise changes in the widths of the anode and cathode conductor stripes may also be provided in various embodiments within the scope of the present invention.

The present invention has been described with respect to particular embodiments thereof, and numerous modifications can be made which are within the scope of the invention as set forth in the claims.

What is claimed is:

1. A device, comprising:

a cathode feeder bus;

an anode feeder bus positioned opposite the cathode feeder bus;

a plurality of elongated cathode conductor stripes, each elongated cathode conductor stripe of the plurality of elongated cathode conductor stripes having a first elongate cathode end portion and a second elongate cathode end portion, the first elongate cathode end portion of each of said elongated cathode conductor stripes being connected to the cathode feeder bus, the width of the second elongate cathode end portion of each of said elongated cathode conductor stripes being narrower than the width of the first elongate cathode end portion of each of said elongated cathode conductor stripes; and a plurality of elongated anode conductor stripes, each elongated anode conductor stripe of the plurality of elongated anode conductor stripes having a first elongate anode end portion and a second elongate anode end portion, the first elongate anode end portion of each of said elongated anode conductor stripes being connected to the anode feeder bus, the width of the second elongate anode end portion of each of said elongated anode conductor stripes being narrower than the width of the first elongate anode end portion of each of said elongated anode conductor stripes, and at least one of the elongated cathode conductor stripes and at least one of the elongated anode conductor stripes being alternately spaced with respect to each other.

2. The device of claim 1, further comprising a semiconductor substrate connected to the cathode and anode feeder buses.

3. The device of claim 2, wherein the semiconductor substrate comprises a plurality of P+ doped regions connected to at least one of the elongated anode conductor stripes.

4. The device of claim 2, wherein the semiconductor substrate comprises a plurality of N+ doped regions connected to at least one of the elongated cathode conductor stripes.

5. The device of claim 1, wherein the elongated anode and cathode conductor snipes comprise metallic stripes.

6. The device of claim 1, wherein at least one of the elongated cathode conductor stripes has a continuously tapered intermediate portion between the first elongate cathode end portion of said at least one of the elongated cathode conductor stripes and the second elongate cathode end portion of said at least one of the elongate cathode conductor stripes.

7. The device of claim 1, wherein at least one of the elongated cathode conductor stripes has a substantially intermediate portion disposed between the first elongate cathode end portion of said at least one of the elongated cathode conductor stripes aid the second elongate cathode end portion of said at least one of the elongated cathode conductor stripes, the substantially intermediate portion of said at least one of the elongated cathode conductor stripes having a width that varies between the width of the first elongate cathode end portion of said at least one of the elongated cathode conductor stripes and the width of the second elongate cathode end portion of said at least one of the elongated cathode conductor stripes.

8. The device of claim 1, wherein the width of the second elongate cathode end portion of said each elongated cathode conductor stripe is about one-half of the width of the first elongate cathode end portion of said each elongated cathode conductor stripe.

9. The device of claim 1, wherein at least one of the elongated anode conductor stripes has a substantially tapered intermediate portion intermediary to the first elongate anode end portion of said at least one of the elongated anode conductor stripes and the second elongate anode end portion of said at least one of the elongated anode conductor stripes.

10. The device of claim 1, wherein at least one of the elongated anode conductor stripes has an intermediate portion disposed between the first elongate anode end portion of said at least one of the elongated anode conductor stripes and the second elongate anode end portion of said at least one of the elongated anode conductor stripes, the intermediate portion of said at least one of the elongated anode conductor stripes having a width that varies abruptly between the width of the first elongate anode end portion of said at least one of the elongated anode conductor stripes and the width of the second elongate anode end portion of said at least one of the elongated anode conductor stripes.

11. The device of claim 1, wherein the width of the second elongate anode end portion of each of said elongated anode conductor stripes is about one-half of the width of the first elongate anode end portion of each of said elongated anode conductor stripes.

12. A device, comprising:

a semiconductor substrate;

a plurality of elongate P+ doped regions in the semiconductor substrate;

a plurality of elongate N+ doped regions in the semiconductor substrate, the P+ and N+ doped regions alternately spaced from each other;

a cathode feeder bus on the semiconductor substrate;

an anode feeder bus on the semiconductor substrate, the anode feeder bus positioned opposite the cathode feeder bus;

a plurality of elongated cathode conductor stripes disposed on the N+ doped regions respectively, each elongated cathode conductor stripe of the plurality of elongated cathode conductor stripes having a first elongate cathode end portion and a second elongate cathode end portion, the first elongate cathode end portion of each of said elongated cathode conductor stripes being connected to the cathode feeder bus, the width of the second elongate cathode end portion of each of said elongated cathode conductor stripes being narrower than the width of the first elongate cathode end portion of each of said elongated cathode conductor stripes; and a plurality of elongated anode conductor stripes disposed on the P+ doped regions respectively, each elongated anode conductor stripe of the plurality of elongated anode conductor stripes having a first elongate anode end portion and a second elongate anode end portion, the first elongate anode end portion of said each elongated anode conductor stripe being connected to the anode feeder bus, the width of the second elongate anode end portion of said each elongated anode conductor stripe being narrower than the width of the first elongate anode end portion of said each elongated anode conductor stripe, the elongated cathode conductor stripes and the elongated anode conductor stripes alternately spaced from each other.

13. The device of claim 12, wherein the elongated anode and cathode conductor stripes comprise metallic stripes.

14. The device of claim 12, wherein each of said elongated cathode conductor stripes has a continuously tapered intermediate portion between the first elongate cathode end portion of each of said elongated cathode conductor stripes and the second elongate cathode end portion of each of said elongated cathode conductor stripes.

15. The device of claim 12, wherein each of said elongated cathode conductor stripes bas an intermediate portion disposed between the first elongate cathode end portion of each of said elongated cathode conductor stripes and the second elongate cathode end portion of each of said elongated cathode conductor stripes, the intermediate portion of each of said elongated cathode conductor stripes having a width that varies abruptly between the width of the first elongate cathode end portion of each of said elongated cathode conductor stripes and the width of the second elongate cathode end portion of each of said elongated cathode conductor stripes.

16. The device of claim 12, wherein the width of the second elongate cathode end portion of each of said elongated cathode conductor stripes is about one-half of the width of the first elongate cathode end portion of each of said elongated cathode conductor stripes.

17. The device of claim 12, wherein said each anode conductor stripe has a continuously tapered intermediate portion between the first elongate anode end portion of each of said elongated anode conductor stripes and the second elongate anode end portion of each of said elongated anode conductor stripes.

18. The device of claim 1, wherein each of said elongated anode conductor stripes has an intermediate portion disposed between the first elongate anode end portion of each of said elongated anode conductor stripes and the second elongate anode end portion of each of said elongated anode conductor stripes, the intermediate portion of each of said elongated anode conductor stripes having a width that varies abruptly between the width of the first elongate anode end portion of each of said elongated anode conductor stripes and the width of the second elongate anode end portion of each of said elongated anode conductor stripes.

19. The device of claim 1, wherein each of said elongated cathode conductor stripes has an intermediate portion disposed between the first elongate cathode end portion of each of said elongated cathode conductor stripes and the second elongate cathode end portion of each of said elongated cathode conductor stripes, the intermediate portion of each of said elongated cathode conductor stripes having a width that varies abruptly between the width of the first elongate cathode end portion of each of said elongated cathode conductor stripes and the width of the second elongate cathode end portion of each of said elongated cathode conductor stripes.

20. A device, comprising:

a substrate;

a cathode feeder bus disposed on the substrate;

an anode feeder bus disposed on the substrate opposite the cathode feeder bus;

a plurality of elongated cathode conductor stripes, each of said elongated cathode conductor stripe comprising a first end portion, a second end portion, and an intermediate portion disposed between the first end portion of each of said elongated cathode conductor stripe and the second end portion of each of said elongated cathode conductor stripe, the first end portion of each of said elongated cathode conductor stripe being connected to the cathode feeder bus, the width of the second end portion of each of said elongated cathode conductor stripe being narrower than the width of the first end portion of each of said elongated cathode conductor stripe, the width of the intermediate portion of each of said elongated cathode conductor stripe varying between the width of the first end portion of each of said elongated cathode conductor stripe and the width of the second end portion of each of said elongated cathode conductor stripe in a continuous but non-differentiable manner at the locations at which the intermediate portion of each of said elongated cathode conductor stripe is joined to tie first end portion of each of said elongated cathode conductor stripe and to the second end portion of each of said elongated cathode conductor stripe; and a plurality of elongated anode conductor stripes, each of said elongated anode conductor stripe comprising a first end portion, a second end portion, and an intermediate portion disposed between the first end portion of each of said elongated anode conductor stripe and the second end portion of each of said elongated anode conductor stripe, the first end portion of each of said elongated anode conductor stripe being connected to the anode feeder bus, the width of the second end portion of each of said elongated anode conductor stripe being narrower than the width of the first end portion of each of said elongated anode conductor stripes the width of the intermediate portion of each of said elongated anode conductor stripes varying between the width of the first end portion of each of said elongated anode conductor stripes and the width of the second end portion of each of said elongated anode conductor stripe in a continuous but non-differentiable manner at the locations at which the intermediate portion of each of said elongated anode conductor stripes is joined to the first end portion of each of said elongated anode conductor stripes and to the second end portion of each of said elongated anode conductor stripes, the elongated conductor stripes and the elongated anode conductor stripes being interdigitated with respect to each other.

* * * * *